US006456496B1

(12) United States Patent
Aldridge et al.

(10) Patent No.: US 6,456,496 B1
(45) Date of Patent: Sep. 24, 2002

(54) TYPE III PCCARD SYSTEM WITH FULL WALL MODULAR EXTENDABLE RJ45/11 CONNECTOR

(75) Inventors: Timothy W. Aldridge, Sandy, UT (US); Jon A. Nelson, Magna, UT (US)

(73) Assignee: 3Com Corporation, Santa Clara, CA (US)

( * ) Notice: Subject to any disclaimer, the term of this patent is extended or adjusted under 35 U.S.C. 154(b) by 0 days.

(21) Appl. No.: 09/702,237

(22) Filed: Oct. 30, 2000

(51) Int. Cl.[7] .............................................. H05K 1/14
(52) U.S. Cl. ....................... 361/737; 439/131
(58) Field of Search .................. 439/74, 131; 361/752, 361/801, 803, 683, 684, 737

(56) References Cited

U.S. PATENT DOCUMENTS

| | | |
|---|---|---|
| 2,916,720 A | 12/1959 | Steans |
| 4,186,988 A | 2/1980 | Kobler |
| 4,241,974 A | 12/1980 | Hardesty |
| 4,303,296 A | 12/1981 | Spaulding |
| 4,352,492 A | 10/1982 | Smith ...................... 273/1 GC |
| 4,407,559 A | 10/1983 | Meyer |
| 4,428,636 A | 1/1984 | Kam et al. |
| 4,710,136 A | 12/1987 | Suzuki ........................ 439/374 |
| 4,778,410 A | 10/1988 | Tanaka ........................ 439/676 |
| 4,915,648 A | 4/1990 | Takase et al. ............... 439/490 |
| 5,035,641 A | 7/1991 | Van-Santbrink et al. .... 439/329 |
| 5,051,099 A | 9/1991 | Pickles et al. ............... 439/108 |
| 5,113,317 A | 5/1992 | Howe .......................... 361/413 |
| 5,139,439 A | 8/1992 | Shie ............................ 439/359 |
| 5,176,523 A | 1/1993 | Lai ............................... 439/64 |
| 5,183,404 A | 2/1993 | Aldous et al. ................. 439/55 |
| 5,184,282 A | 2/1993 | Kaneda et al. ............... 361/395 |
| 5,225,968 A | 7/1993 | Ma .............................. 361/413 |
| 5,316,488 A | 5/1994 | Gardner et al. ............... 439/79 |
| 5,334,046 A | 8/1994 | Brouillette et al. .......... 439/540 |
| 5,336,099 A | 8/1994 | Aldous et al. ............... 439/131 |
| 5,338,210 A | 8/1994 | Beckham et al. ............ 439/131 |
| 5,391,094 A | 2/1995 | Kakinoki et al. ............ 439/638 |
| 5,411,405 A | 5/1995 | McDaniels et al. .......... 439/131 |

(List continued on next page.)

FOREIGN PATENT DOCUMENTS

| | | |
|---|---|---|
| EP | 0 355 413 | 7/1989 |
| JP | 58/34370 | 5/1983 |
| JP | 61/256850 | 11/1986 |
| WO | WO 95/13633 | 5/1995 |

OTHER PUBLICATIONS

IBM Technical Disclosure Bulletin, "Electrical Connector For Flat Flexible Cable," vol. 25, No. 1, Jun. 1982.

Primary Examiner—Brian Sircus
Assistant Examiner—Thanh-Tam Le
(74) Attorney, Agent, or Firm—Workman, Nydegger & Seeley (57) ABSTRACT

An interlocking computer card device having computer module dimensions such as a PCMCIA type III architecture comprising two PCMCIA type II computer card devices. Each computer card device has a full wall extendable media connector and a substantially identical computer card housing. The full wall extendable media connector can be configured to couple with a media-plug facing different directions or it can be attached to an antenna for receiving wireless communications. The computer card housing has a bottom planar surface, a top planar surface, a connector housing that extends out of the top planar surface and a recess that has substantially the same shape as the connector housing. The computer card housing also has protrusions and dimples that are configured for coupling with corresponding dimples and protrusions of another computer card housing.

35 Claims, 6 Drawing Sheets

U.S. PATENT DOCUMENTS

| | | | | |
|---|---|---|---|---|
| 5,451,168 A | | 9/1995 | Shuey | 439/159 |
| 5,477,418 A | * | 12/1995 | MacGregor et al. | 361/737 |
| 5,481,616 A | | 1/1996 | Freadman | 381/90 |
| 5,486,687 A | | 1/1996 | Le Roux | 235/382 |
| 5,499,923 A | | 3/1996 | Archibald et al. | 439/26 |
| 5,505,633 A | | 4/1996 | Broadbent | 439/329 |
| 5,509,811 A | | 4/1996 | Homic | 439/55 |
| 5,538,442 A | | 7/1996 | Okada | 439/676 |
| 5,547,401 A | | 8/1996 | Aldous et al. | 439/676 |
| 5,561,727 A | | 10/1996 | Akita et al. | 385/88 |
| 5,562,504 A | * | 10/1996 | Moshayedi | 439/638 |
| 5,608,606 A | | 3/1997 | Blaney | 361/686 |
| 5,608,607 A | | 3/1997 | Dittmer | 361/686 |
| 5,619,396 A | | 4/1997 | Gee et al. | 361/686 |
| 5,628,031 A | | 5/1997 | Kikinis et al. | 395/893 |
| 5,634,802 A | | 6/1997 | Kerklaan | 439/131 |
| 5,645,434 A | * | 7/1997 | Leung | 439/74 |
| 5,660,568 A | | 8/1997 | Moshayedi | 439/654 |
| 5,667,390 A | | 9/1997 | Keng | 439/76.1 |
| 5,667,395 A | * | 9/1997 | Okada et al. | 439/131 |
| 5,679,013 A | | 10/1997 | Matsunaga et al. | 439/144 |
| 5,692,914 A | * | 12/1997 | Mitani et al. | 439/131 |
| 5,727,972 A | | 3/1998 | Aldous et al. | 439/655 |
| 5,754,405 A | * | 5/1998 | Derouiche | 361/44 |
| 5,768,098 A | * | 6/1998 | Murayama | 361/684 |
| 5,773,332 A | | 6/1998 | Glad | 439/344 |
| 5,797,771 A | | 8/1998 | Garside | 439/610 |
| 5,816,832 A | | 10/1998 | Aldous et al. | 439/131 |
| 5,876,218 A | | 3/1999 | Liebenow et al. | 439/74 |
| 5,884,319 A | | 3/1999 | Hafner et al. | 707/104 |
| 5,988,511 A | | 11/1999 | Schmidt et al. | 235/492 |
| 6,008,985 A | | 12/1999 | Lake et al. | 361/686 |
| 6,085,925 A | * | 7/2000 | Chung | 220/4.02 |
| 6,183,307 B1 | * | 2/2001 | Laity et al. | 439/676 |
| 6,217,391 B1 | | 4/2001 | Colantuono et al. | 439/676 |

* cited by examiner

TYPE III PCCARD SYSTEM WITH FULL WALL MODULAR EXTENDABLE RJ45/11 CONNECTOR

BACKGROUND OF THE INVENTION

1. The Field of the Invention

The present invention relates to an interlocking computer card apparatus having PCMCIA type III architecture and comprising two PCMCIA type II computer card devices. More particularly, it pertains to a computer card device having a full wall modular extendable media connector.

2. The Relevant Technology

It is well recognized that the computer industry is experiencing tremendous growth. This growth is largely driven by a demand for computer devices that can provide immediate access to information. One prevalent use of computers today is to access the Internet, a world wide network of electronically stored data. Computers are also used to access local area networks ("LANs") and wide area networks ("WANs") which also store electronically retrievable data.

Although there are numerous public and private networks and databases which store data or programs, absent the ability to connect directly with a network, a computer user is relegated to relying upon the exchange of discs or tapes in order to receive the data that is accessible through the network.

The ability to freely access data on a network and to transfer information between computers can dramatically increase productivity and reduce overall production time. The transfer of data over a network can be accomplished with wireless technology or by telephone lines and cables. The interface between a computer and a cable or telephone line is typically accomplished through a media connector.

One conventional type of media connector is the RJ-series connector. RJ-series connectors are used by almost all telephone companies throughout the world for many applications, the most important of which is interconnection of telephones with telephone lines. For this reason, stringent standardization of connectors has been established to enable compatibility and interactivity. Due to the simplicity of the connection and the established standards, RJ-series connectors are used extensively in the computer industries and in other industries where communication over telephone lines or other types of cables is required.

RJ-series connectors include a plug or contact block and a receptacle or socket. The plug comprises a small block shaped body coupled with a cable, such as a telephone line. Housed within the body are several contact pins. Each of the contact pins is attached to a discrete wire within the cable. Mounted on the outside of the body is a flexible retention clip that is used for removably securing the plug within the socket of an electrical apparatus.

The socket is typically formed on the side of the electrical apparatus and is configured to receive the plug. Disposed within the socket are flexible contact wires. The contact wires within the socket are biased against corresponding contacts on the plug to complete the electrical connection between the plug and the electrical apparatus.

The interior surface of the socket comprises a latching mechanism that receives the retention clip of the plug so as to mechanically secure the plug within the socket by holding retention notches of the retention clip. To remove the plug, the retention clip is manually flexed towards the body of the plug to release the hold of the latching mechanism on the retention notches, thereby enabling manual removal of the plug from the socket.

As the computer industry continues to develop, new peripheral devices are being created to satisfy the demand for more immediate access to information. These peripheral devices include, but are not limited to, wireless cellular modems, facsimile modems, modular random access memory, and network interface connectors.

However, size constraints limit the number of peripheral devices a single computer can incorporate. This is particularly true for portable computers that are being redesigned to be smaller and more portable all the time. Most portable computers are designed to incorporate only some of the available devices. Incorporating every available device into a single portable computer would substantially increase the price of the computer while decreasing its portability. A computer user also may not require or desire all of the available peripheral devices. Accordingly, the computer industry has developed standards that enable peripheral computer devices to be selectively integrated and interchanged.

The most common standards have been established by the Personal Computer Memory Card International Association (PCMCIA). PCMCIA standards specify spatial size restrictions and coupling interface restrictions for computer cards that embody peripheral computer devices. According to PCMCIA standards, there are three types of card architectures that vary in thickness. A type I PCMCIA card has a thickness of approximately 3.3 mm. A type II PCMCIA card has a thickness of approximately 5.0 mm. A type III PCMCIA card has a thickness of approximately 10.5 mm. All three of these card types also have a 68-pin female connector, a width of 55 mm, a length of 85 mm, and edges that are configured for slidably engaging channels of a corresponding expansion slot in an electronic apparatus.

PCMCIA standards enable a computer user to selectively use a first peripheral device and later remove it when it is no longer needed. This is particularly useful because it allows a computer user to interchange a peripheral device based on particular needs. By way of example and not limitation, a computer user may first access data stored on an auxiliary memory card and later exchange the auxiliary memory card for a network interface card to access a LAN.

In keeping with PCMCIA standards, various manufacturers build computer card devices that meet the required specifications. Computer card devices that perform I/O operations are typically configured to comply with the PCMCIA type II architecture. Because these computer card devices are thinner than RJ-series media plugs, either adapters or extendable media connectors are required to connect an RJ-series media plug to a PCMCIA type II computer card device.

One skilled in the art should recognize a dongle as a typical adapter. Dongles, however, are problematic because they have to be stored and can easily be misplaced. Extendable media connectors, as embodied in U.S. Pat. No. 5,183,404, issued to Aldous et al., are one solution to this problem. Extendable media connectors have a profile that is thinner than the media plug and can be slidably retracted into the housing of the computer card device. Despite the benefits of traditional extendable media connectors, some computer users prefer full wall media connectors because they feel full wall media connectors are more robust than the thinner profile extendable media connectors. extendable media connector.

Traditionally, full wall media connectors have only a single socket or receptacle that is configured for coupling with only a single type of media plug from only a single direction. However, because of personal preferences and physical constraints, it would also be desirable to provide a full wall extendable media connector that can couple with different types of media plugs from multiple directions.

One problem with equipping a PCMCIA type II card with a full wall media plug connector is that it prevents stacking of computer cards. Stacking two PCMCIA type II computer cards within a single type III expansion slot of an electrical apparatus is a common practice in the industry to maximize the capacity of the electrical apparatus to incorporate various peripheral devices. By way of example, and not limitation, an exemplary stacking configuration might include a modem card stacked above a network interface card.

Because a full wall media plug connector has the approximate thickness of a PCMCIA type III expansion slot, it is not possible to stack two computer card devices on top of one another within a single type III expansion slot if both of the computer card devices are configured with full wall extendable media connectors.

A similar problem is encountered by the use of thin profile extendable media connectors. Although thin profile extendable media connectors do not prevent computer cards from being stacked, they may prevent simultaneous use of the peripheral devices, which defeats the purpose of stacking the computer cards. For example, the coupling of a first media plug with a thin profile media connector of a first computer card may obstruct the coupling of a second media plug with the thin profile media connector of a second computer card. This occurs when the first media plug extends beyond the thin profile media connector into the space that is required for coupling of the second media plug. Even if a thin media plug adapter, such as a dongle is used, the extension of the media plug through the thin profile media connector may still extend too far down into the space required by the dongle for connection to the second computer card device.

Accordingly, it would, therefore, be desirable to provide a computer card apparatus that allows two computer card devices having full wall extendable media connectors to be stacked and simultaneously connected to corresponding media plugs. It would also be desirable to provide this result while enabling the full wall extendable media connectors to be coupled to corresponding media plugs of different types from multiple directions.

BRIEF SUMMARY OF THE INVENTION

A full wall extendable media connector is provided for coupling with RJ-series media plugs. The full wall extendable media connector is retractably attached to a computer card device. However, it should be appreciated that the full wall extendable media connector of the present invention can also be connected directly to an electrical apparatus.

The RJ-series media plug comprises a small block shaped body coupled with a cable, such as a telephone line. Housed within the plug body are distinct contact pins. Each of the contact pins are attached to discrete wires within the cable.

The computer card device comprises a full wall extendable media connector that is slidably retractable into a computer card housing and has a first end that is attached to the computer card device and a second end that has a face and four sides. Any combination of the sides and the face can be configured to couple with an RJ-series media plug. A plurality of contact wires are housed within the full wall extendable media connector.

During use, a media plug is coupled with a full wall extendable media connector and the contact wires of the full wall extendable media connector are biased against the contact pins of the media plug, thereby effecting electrical communication between the media plug and the computer card. This direct connection obviates the need for conventional adapters to facilitate connection of the media plug.

The full wall extendable media connector of the present invention can also be designed in a variety of alternative embodiments. For example, in one alternative embodiment a turret rotatably connects the second end of the full wall extendable media connector to the first end of the full wall extendable media connector. This embodiment enables a media plug to be connected to the full wall extendable media connector from multiple directions.

In another embodiment, the second end of the full wall extendable media connector is connected to an antenna for receiving wireless communications. In yet another embodiment the full wall extendable media connector is translucent and is illuminated by light pipes.

The computer card housing comprises a bottom planar surface, a top planar surface, a connector housing that extends out of a first corner area of the top planar surface, and a recess that extends between a second corner area of the top planar surface and the bottom planar surface and has substantially the same shape as the connector housing. The computer card housing is configured for interlocking with a substantially identical housing of a second computer card device.

When two computer card devices are interlocked, the top planar surface of the first computer card housing engages the top planar surface of the second computer card housing and the connector housings of both computer card devices slidably engage the recesses formed in the alternate computer card housings. To further interlock the computer card devices and to provide alignment, the top planar surface of one computer card device has protrusions and dimples that mate with corresponding dimples and protrusions of the top planar surface of the second computer card device.

One of the unique benefits of the present invention is that it provides a PCMCIA type II computer card with a full wall extendable connector that can couple with a media plug from multiple directions. Another benefit of the present invention is that is allows two computer card devices to be stacked and simultaneously connected to different types of media plugs within a single type III expansion slot.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE PREFERRED EMBODIMENTS

The present invention relates to computer card devices having full wall extendable media connectors.

The full wall extendable media connector of the present invention is configured to electrically and mechanically couple with a corresponding media plug. Examples of media plugs include, but are not limited to, RJ-11 and RJ-45 series plugs. The full wall extendable media connector of the present invention is also configured to slidably retract into the housing of a computer card device.

In many of the depicted examples, the inventive full wall extendable media connector is configured to receive RJ-series plugs. However, it should be appreciated that the present invention contemplates that it would be obvious to one skilled in the art based on the present disclosure to modify the depicted full wall extendable media connector to receive other types of media plugs including nonstandard plugs and plugs that are developed or standardized in the future.

The term "electrical apparatus," as used in the specification and appended claims, is broadly intended to include any apparatus having electrical components. By way of example and not limitation, some of the more conventional electrical apparatus include: network computers, laptop computers, personal computers, notebook computers, palm top computers, PDA's, and modems. Non-conventional electrical apparatus can include, among other things, televisions, stereo equipment, other electrical musical devices, electrical tools, electrical appliances, and automobiles.

The term "computer card device," as used in the specification and appended claims, is broadly intended to include any computer card device having a PCMCIA card architecture. By way of example and not limitation, some of the more conventional computer card devices include: Network interface cards, wireless cellular cards, modem cards, LAN application cards, modular random access memory cards, and other PCMCIA cards.

The term "interlocking computer card apparatus," as used in the specification and appended claims, is broadly intended to include two interlocked computer card devices that together comprise a PCMCIA type III architecture. By way of example and not limitation, an exemplary interlocking computer card apparatus may include a network interface card interlocked with a wireless cellular card.

Figure 1:
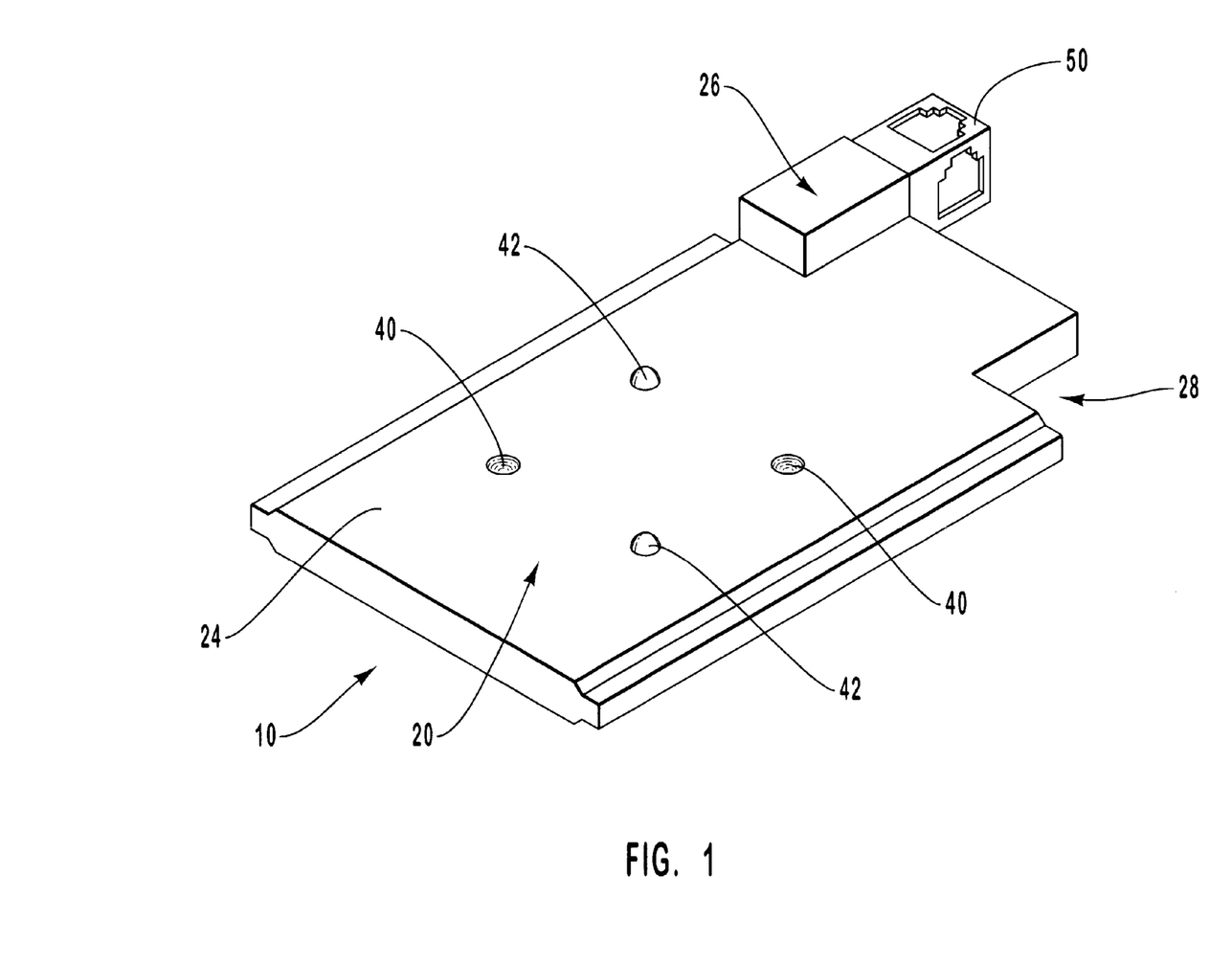
FIG. 1 is a perspective top view of one presently preferred embodiment of the computer card device of the present invention.
Figure 2:
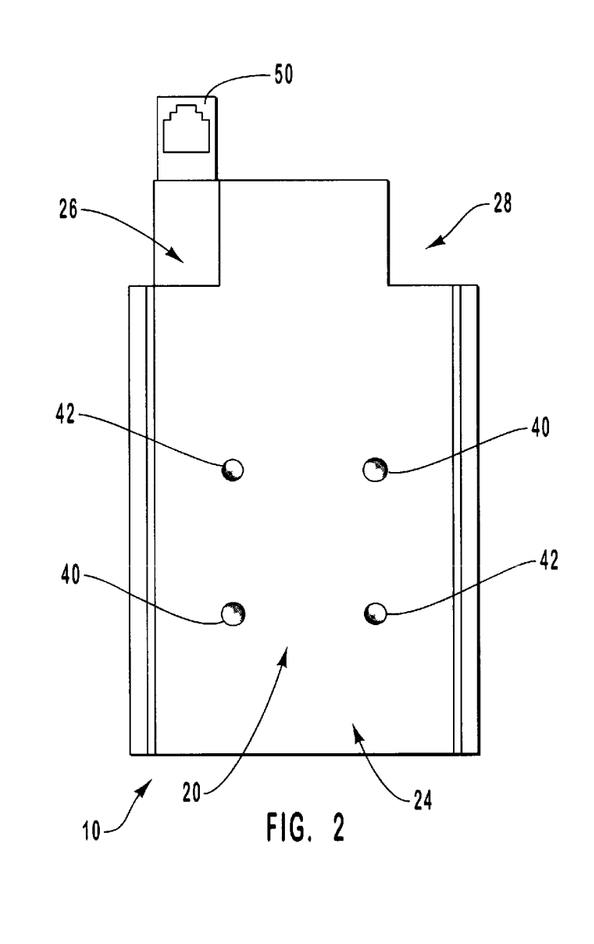
FIG. 2 illustrates a top view of one presently preferred embodiment of the computer card device of the present invention.
Figure 3:
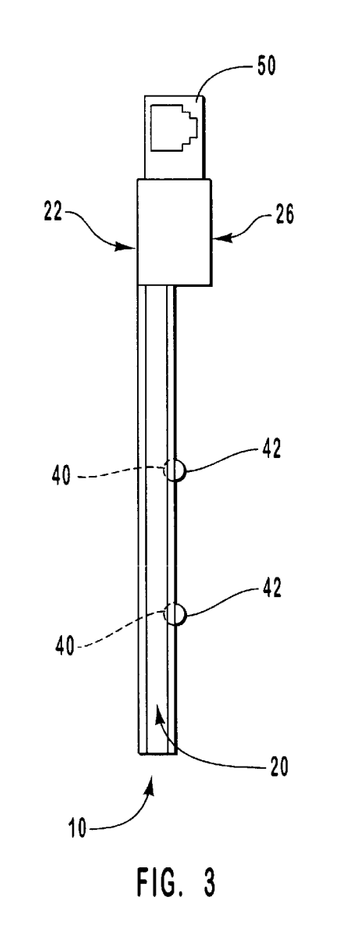
FIG. 3 is a perspective side view of one presently preferred embodiment of the computer card device of the present invention.

FIGS. 1–3 depict one presently preferred embodiment of the computer card device 10 of the present invention. As shown, the computer card device 10 comprises a computer card housing 20. The computer card housing 20 includes a bottom planar surface 22 (shown in FIG. 3), a top planar surface 24, a connector housing 26, and a recess 28.

In one embodiment, the connector housing 26 rectilinearly extends out of a front corner area of the top planar surface 24. The connector housing 26 is configured for slidably engaging a recess 28 formed in another computer card housing 20 that has substantially the same shape as the recess 28. An example of an extension/retraction mechanism is illustrated in U.S. Patent No. (U.S. patent application Ser. No.: 09/201,682; entitled "System and Apparatus for Retaining Position of Cam Follower" filed on Nov. 30, 1998.

The recess 28 extends between a second front corner area of the top planar surface 24 and the bottom planar surface 22. The recess 28 has substantially the same shape as the connector housing 26 and is configured for slidably receiving a connector housing 26 of another computer card housing 20. It should be appreciated that the exact shape and location of the recess 28 and the connector housing 26 can be modified without departing from the spirit of the present invention.

Also shown in FIGS. 1–3, are dimples 40 and protrusions 42. The protrusions 42 protrude away from the top planar surface 24 and are substantially the same size and shape as the dimples 40 that extend into the top planar surface 24. Accordingly, the protrusions 42 and dimples 40 are configured for coupling with corresponding dimples 40 and protrusions 42 of another computer card device 10.

The purpose of the dimples 40 and protrusions 42 is to provide alignment and interlocking support when two computer card devices 10, having substantially identical computer card housings 20, are interlocked. Accordingly, it should be appreciated that the number, size and shape of the protrusions 42 and corresponding dimples 40 can be modified without departing from the spirit of the present invention.

In the presently preferred embodiment, the computer card device also comprises a block shaped full wall extendable media connector 50. This means the full wall extendable media connector 50 can extend away from the computer card device and that it is configured for receiving the entire body of a media plug. Accordingly, the width, thickness and depth of the full wall extendable media connector 50 are greater than the width, thickness and depth of a corresponding media plug.

Figure 4:
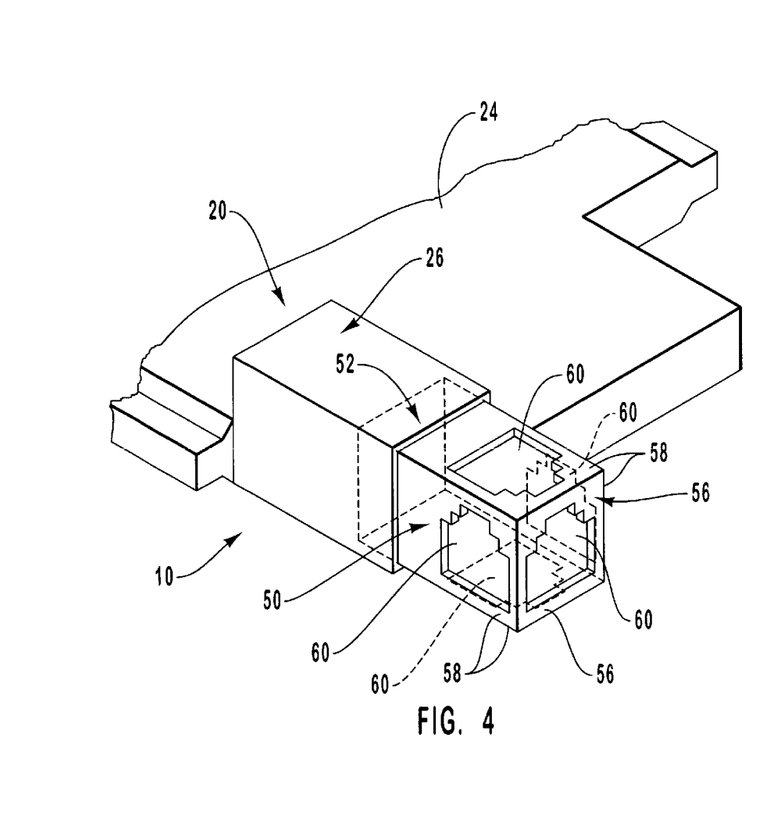
FIG. 4 illustrates a perspective view of one presently preferred embodiment of a full wall extendable media connector of the computer card device of the present invention.

FIG. 4 illustrates one embodiment of the full wall extendable media connector 50. As shown, the full wall extendable media connector 50 has a first end 52, and a second end 54. The first end 52 is connected to the computer card device 10 and housed within the connector housing 26. The full wall extendable media connector 50 is also slidably retractable into the computer card housing 20, specifically within the connector housing 26.

The second end 54 of the full wall extendable media connector 50 has a face 56 and four sides 58. Each of the four sides 58 and the face 56 can be configured to couple with a media plug. In particular, apertures 60 extend into the full wall extendable media connector and are configured for receiving the body of a media plug. As shown, apertures 60 can be formed into each of the four sides 58 and the face 56 of the second end 54 of the full wall extendable media connector 50.

It is useful for the full wall extendable media connector 50 to have multiple apertures 60 because it enables a user to connect a media plug to the full wall extendable media connector 50 from different directions. This is particularly important when physical or environmental constraints restrict the movement of a media plug. One such constraint includes having the media plug attached to a very short cable or telephone line.

This embodiment is also useful for enabling the full wall extendable media connector 50 to be coupled with different types of media plugs. By way of example and not limitation, one aperture 60 may be configured for receiving the body of an RJ-11 series plug and another aperture 60 may be configured for receiving the body of an RJ-45 series plug.

In one alternative embodiment, the full wall extendable media connector 50 has only one aperture 60 that extends through the face 56 of the full wall extendable media connector 50. In another embodiment, the full wall extendable media connector has only one aperture 60 that extends through one of the four sides 58. These embodiments may be preferred for manufacturing reasons. It should be appreciated, however, that it would be obvious to one skilled in the art based on the present disclosure to modify the depicted full wall extendable media connector 50 to comprise various combinations of apertures 60 extending through any combination of the four sides 58 and the face 56.

Located within the full wall extendable media connector 50 are contact wires, not shown. During use, a media plug is coupled with the full wall extendable media connector 50 by inserting the media plug body into the aperture 60. In so doing, the contact wires of the full wall extendable media connector 50 engage contact pins on the media plug, completing an electrical connection between the media plug and the computer card device 10.

Figure 5:
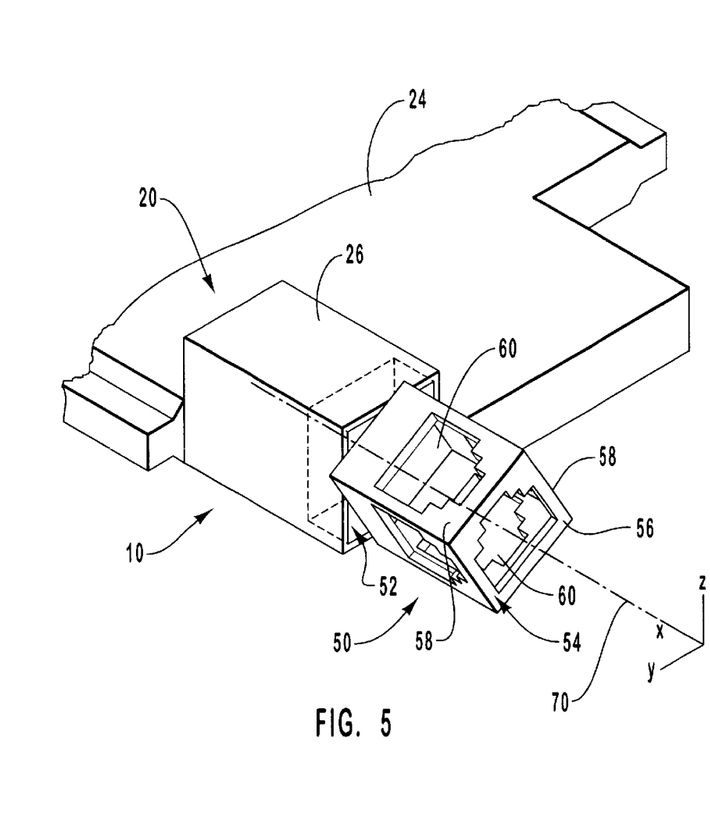
FIG. 5 illustrates a bottom perspective view of one presently preferred embodiment of a full wall extendable media connector that includes having one end rotated about an axis.

FIG. 5 illustrates another embodiment of the full wall extendable media connector 50. In this embodiment, a turret, not shown, rotatably connects the second end 54 of the full wall extendable media connector 50 to the first end 52 of the full wall extendable media connector 50. This allows the second end 54 to be rotated about an axis 70 that runs parallel to the four sides 58 and through the center of the face 56. This embodiment is useful when only one of the four sides 58 is configured for receiving a media plug because it enables a user to rotate the second end 54 until the aperture 60 is facing the direction that is most convenient for coupling with the media plug.

Figure 6:
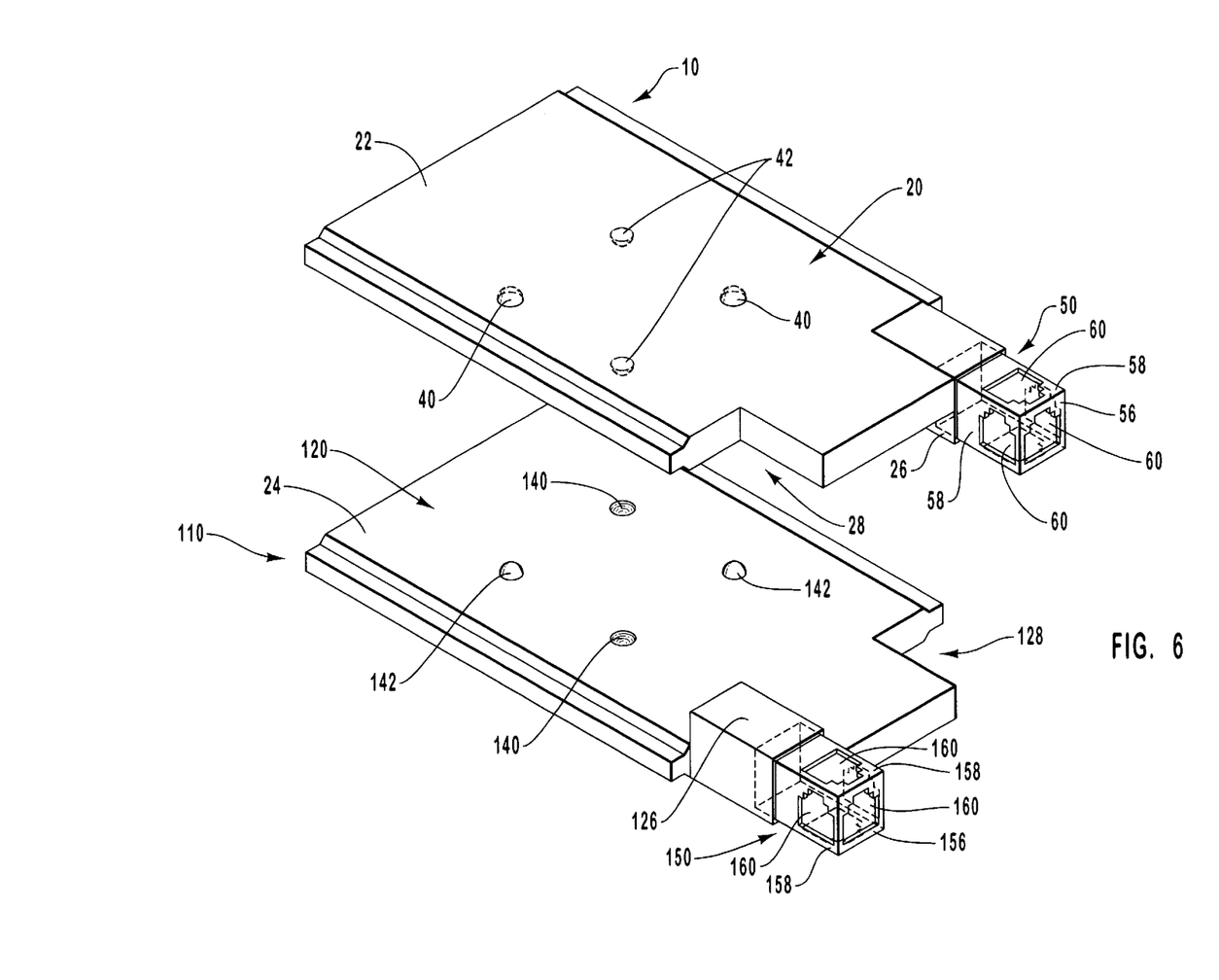
FIG. 6 illustrates a perspective side view of two computer card devices of the present invention.

FIG. 6 illustrates two computer card devices 10 and 110. Both of these computer card devices 10 and 110 are PCMCIA type II cards and have substantially identical computer card housings 20 and 120. By way of example and not limitation, computer card device 10 may be a network interface card and computer device 110 may be a modem card. In this embodiment, the connector housings 26 and 126 have substantially the same shape as the recesses 28 and 128. The protrusions 42 and 142 are also substantially the same size and shape as the dimples 40 and 140. Accordingly, the computer card devices 10 and 110 are suitably configured for being interlocked.

To interlock computer card device 10 with computer card device 110, the computer card housing 20 is pressed against the computer card housing 120 in such a way as that the connector housing 26 slidably engages the recess 128 and the connector housing 126 slidably engages the recess 28. By doing this, the protrusions 42 will couple with the dimples 140 and the protrusions 142 will couple with the dimples 40.

Figure 7:
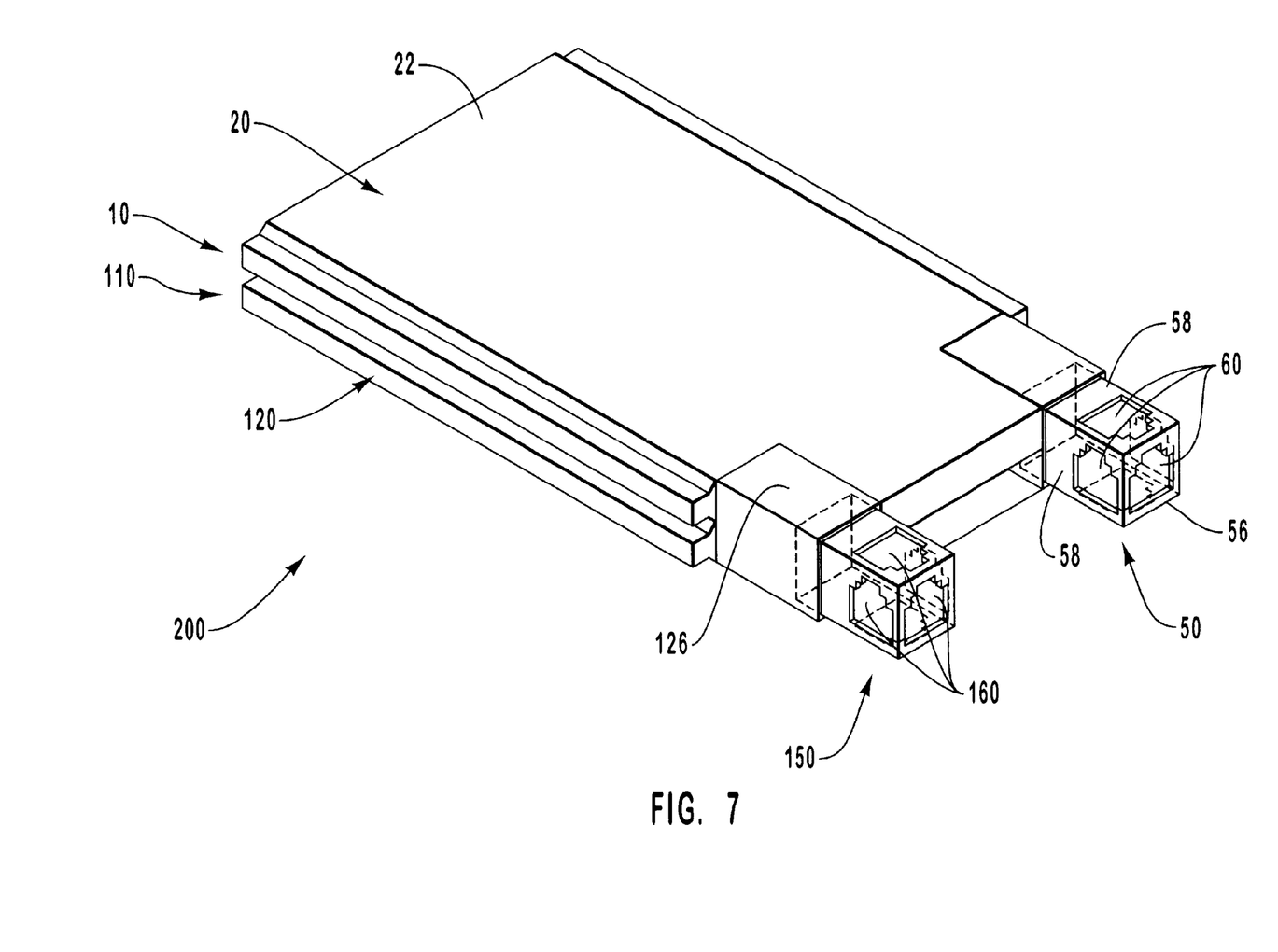
FIG. 7 illustrates a perspective side view of one presently preferred embodiment of the interlocking computer card apparatus of the present invention.

FIG. 7 illustrates the interlocking computer card apparatus 200 of the present invention. As shown, the computer card device 10 is interlocked with a second computer card device 110. The interlocking computer card apparatus 200 has a uniform thickness and a PCMCIA type III architecture that is suitably configured for slidably engaging a type III expansion slot of an electrical apparatus.

As shown in FIG. 7, both of the computer card devices 10 and 110 have full wall extendable media connectors 50 and 150 that are configured for coupling with a media plug from multiple directions. The present invention allows each of the full wall extendable media connectors 50 and 150 to simultaneously couple with a corresponding media plug without obstructing the connection of the other full wall extendable media connector 50 and 150. This is an important feature of the present invention because it allows two computer card devices 10 and 110 to be used simultaneously even though they may each require a connection to a media plug. It should be appreciated that this is an improvement over the prior art.

Figure 8:
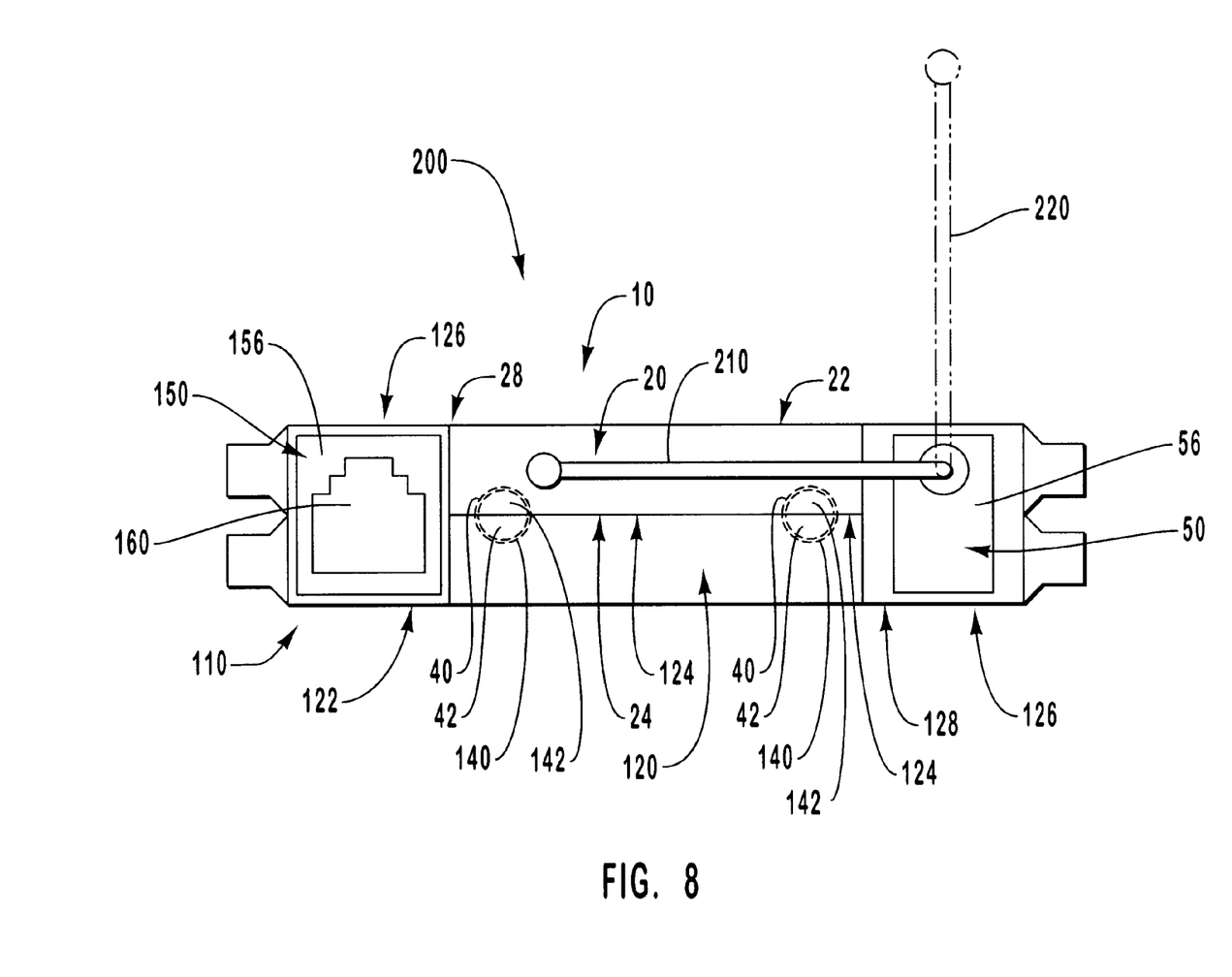
FIG. 8 illustrates a front view of one embodiment of the interlocking computer card apparatus of the present invention.

FIG. 8 illustrates a front view of the interlocking computer card apparatus 200 of the present invention that includes having computer card device 10 interlocked with computer card device 110. As shown, the top planar surface 24 of the first computer card housing 20 is engaged with the top planar surface 124 of the second computer card housing 120. Also shown, the connector housing 26 is slidably engaged with the recess 128 and the connector housing 126 is slidably engaged with the recess 28.

To provide additional interlocking support and alignment, the dimples 40 and the protrusions 42 of the computer card device 10 are coupled with the respective protrusions 142 and dimples 140 of the computer card device 110. Additional interlocking support and alignment is an important feature of the present invention because it enables the interlocking computer card apparatus 200 to be freely inserted into a type III expansion slot and removed without being obstructed by protruding comers of either of the two computer card devices 10 and 110.

FIG. 8 also illustrates the interlocking computer card device 200 of the present invention can be configured to receive wireless communications. As shown, an antenna 210 is connected directly to the second end 54 of the full wall extendable media connector 50 and is positioned horizontally in a first position. The antenna 210 enables the computer card device 10 to receive wireless communications. By way of example and not limitation, computer card device can be a wireless cellular card.

When the computer card device 10 is going to be used then the antenna 210 can be rotated to a second position 220 as shown or to another position that provides an adequate reception. One skilled in the art will recognize there are various appropriate means for rotating the antenna 210. By way of example, and not limitation, one such means includes a turret that rotatably connects the second end 54 of the full wall extendable media connector 50 to the first end 52, as previously discussed.

It should also be appreciated that the computer card housing 20 can also be configured with an aperture to receive the antenna 210, so that when the full wall extendable media connector 50 is slidably retracted into the computer card housing 20 the antenna 210 does not extend beyond the profile of the front of the interlocking computer card apparatus 200, protecting the antenna 210 from ancillary damage.

In an alternative embodiment, the full wall extendable media connector 50 is translucent and is connected to light pipes that illuminate the full wall extendable media connector 50 whenever the antenna 210 receives a signal. It is also contemplated by the present invention to similarly configure the full wall extendable media connector 150 so that it is illuminated whenever the computer card device 110 receives a signal from a corresponding media plug.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A computer card device comprising:
    a housing configured for interlocking with a substantially identical housing of another computer card device, said housing of the computer card device comprising:
    (a) a bottom planar surface;
    (b) a top planar surface;
    (c) a connector housing that extends out of a first area of the top planar surface; and
    (d) a recess that extends between a second area of the top planar surface and the bottom planar surface and has substantially the same shape as the connector housing; and
    an extendable media connector at least partially disposed in the connector housing, wherein the media connector comprises four sides and a face, and wherein each of at least two of the four sides and face defines an aperture for receiving a media plug.

2. A computer card device as recited in claim 1, wherein the first area of the top planar surface is a first front corner of the top planar surface, and wherein the second area of the top planar surface is a second front corner of the top planar surface.

3. A computer card device as recited in claim 1, wherein the top planar surface has at least one dimple extending into said top planar surface and at least one protrusion protruding away from said top planar surface, and wherein said at least one dimple and at least one protrusion have substantially the same size and shape.

4. A computer card device as recited in claim 1, wherein said computer card device is a PCMCIA card.

5. A computer card device as recited in claim 1, wherein the thickness of the housing between the top planar surface and the bottom planar surface is approximately 5 mm.

6. A computer card device as recited in claim 1, wherein the thickness of the housing between a top surface of the connector housing and the bottom surface of the computer card housing is approximately 10.5 mm.

7. A computer card device comprising:
    a full wall extendable media connector having a first end that is attached to the computer card device and a second end having a face and four sides; and wherein each of at least two of the four sides and face defines an aperture for receiving a media plug; and
    a computer card housing configured for interlocking with a substantially identical housing of another computer card device, said computer card housing comprising:
    (a) a bottom planar surface;
    (b) a top planar surface;
    (c) a connector housing that extends out of a first area of the top planar surface; and
    (d) a recess that extends between a second area of the top planar surface and the bottom planar surface and has substantially the same shape as the connector housing.

8. A computer card device as recited in claim 7, wherein the first area of the top planar surface is a first front corner of the top planar surface, and wherein the second area of the top planar surface is a second front corner of the top planar surface.

9. A computer card device as recited in claim 7, wherein the full wall extendable media connector is slidably retractable into the computer card housing.

10. A computer card device as recited in claim 7, wherein the second end of the full wall extendable media connector is attached to an antenna.

11. A computer card device as recited in claim 10, wherein the full wall extendable media connector is translucent and is illuminated by light pipes when the antenna is receiving a signal.

12. A computer card device as recited in claim 7, wherein the media plug is one of either an RJ-11 series plug and an RJ-45 series plug.

13. A computer card device as recited in claim 7, wherein the face of the second end of the full wall extendable media connector and at least one of the sides of the second end of the full wall extendable media connector is configured for coupling with a media plug.

14. A computer card device as recited in claim 13 wherein the media plug is one of either and RJ-11 series plug and an RJ-45 series plug.

15. A computer card device as recited in claim 7, wherein a turret rotatably connects the second end of the full wall extendable media connector to the first end of the full wall extendable media connector.

16. An interlocking computer card apparatus configured for slidably engaging an expansion slot of an electrical apparatus, said interlocking computer card apparatus comprising:
    a first computer card device having a first computer card housing comprising:
    (a) a bottom planar surface;
    (b) a top planar surface;
    (c) a connector housing that extends out of a first area of the top planar surface; and
    (d) a recess that extends between a second area of the top planar surface and the bottom planar surface and has substantially the same shape as the connector housing; and
    a second computer card device having a second computer card housing that is substantially identical to the computer card housing of the first computer card device and comprising: a bottom planar surface, a top planar surface, a connector housing that extends out of a first area of the top planar surface, and a recess that extends between a second area of the top planar surface and the bottom planar surface and has substantially the same shape as the connector housing, wherein the top planar surface of the second computer card housing engages the top planar surface of the first computer card housing; and
    a first extendable media connector at least partially disposed in the connector housing of the first computer card housing, wherein the first media connector comprises four sides and a face, and wherein each of at least two of the four sides and face defines an aperture for receiving a media plug.

17. An interlocking computer card apparatus as recited in claim 16, wherein the connector housing of the first computer card housing slidably engages a recess of the second computer card housing and wherein a connector housing of the second computer card housing slidably engages the recess of the first computer card housing.

18. An interlocking computer card apparatus as recited in claim 17, wherein the first area of the top planar surface is a first front corner of the top planar surface, and wherein the second area of the top planar surface is a second front corner of the top planar surface.

19. An interlocking computer card apparatus as recited in claim 17, wherein the top planar surface of the first computer card device has at least one protrusion, and wherein the top planar surface of the second computer card device has at least one dimple, such that the at least one protrusion is coupled with the at least one dimple.

20. An interlocking computer card apparatus as recited in claim 16, wherein the first extendable media connector is slidably retractable into the connector housing of the first computer card housing, and wherein the second extendable media connector is slidably retractable into the connector housing of the second computer card housing.

21. An interlocking computer card apparatus as recited in claim 16, wherein the interlocking computer card apparatus has a PCMCIA type III architecture.

22. An interlocking computer card apparatus as recited in claim 16, wherein the expansion slot of the electrical apparatus is a PCMCIA type III expansion slot.

23. An interlocking computer card apparatus as recited in claim 16, wherein the interlocking computer card apparatus has a substantially uniform thickness.

24. An interlocking computer card apparatus as recited in claim 16, wherein the first and second computer card devices are PCMCIA type II cards.

25. An interlocking computer card apparatus as recited in claim 16, further comprising:
   a second extendable media connector at least partially disposed in the connector housing of the second computer card housing, wherein the second media connector comprises four sides and a face, and wherein each of at least two of the four sides and face defines an aperture for receiving a media plug.

26. An interlocking computer card apparatus configured for slidably engaging an expansion slot of an electrical apparatus, said interlocking computer card apparatus comprising:
   a first computer card device having a first full wall extendable media connector and a first computer card housing, the first full wall extendable media connector having a first end that is attached to the first computer card device and a second end having a face and four sides, wherein each of at least two of the four sides and face of the second end of the first full wall extendable media connector defines an aperture for receiving a media plug, the first computer card housing comprising:
      (a) a bottom planar surface;
      (b) a top planar surface;
      (c) a connector housing that rectilinearly extends out of a first comer area of the top planar surface; and
      (d) a recess that extends between a second comer area of the top planar surface and the bottom planar surface, said recess configured for slidably receiving a connector housing that is substantially identical to the connector housing of the first computer card housing; and
   a second computer card device comprising:
      (e) a second full wall extendable media connector having a first end that is attached to the second computer card device and a second end having a face and four sides; and
      (f) a second computer card housing that is substantially identical to the computer card housing of the first computer card device, wherein a top planar surface of the second computer card housing engages the top planar surface of the first computer card housing.

27. An interlocking computer card apparatus as recited in claim 26, wherein a connector housing of the second computer card housing slidably engages the recess of the first computer card housing, and wherein the connector housing of the first computer card housing engages a recess of the second computer card housing.

28. An interlocking computer card apparatus as recited in claim 26, wherein the second end of the second full wall extendable media connector is attached to an antenna.

29. An interlocking computer card apparatus as recited in claim 26, wherein each of at least two of the four sides and face of the second end of the second full wall extendable media connector defines an aperture for receiving a media plug.

30. An interlocking computer card apparatus as recited in claim 29, wherein the media plug is one of either an RJ-11 series plug and an RJ-45 series plug.

31. An interlocking computer card apparatus as recited in claim 26, wherein the expansion slot is a PCMCIA type III expansion slot.

32. An interlocking computer card apparatus as recited in claim 26, wherein the interlocking computer card apparatus has a PCMCIA type III architecture.

33. An interlocking computer card apparatus as recited in claim 32, wherein the first computer card device and the second computer card device are type II PCMCIA cards.

34. An interlocking computer card apparatus as recited in claim 26, wherein the first full wall extendable media connector is slidably retractable into the connector housing of the first computer card housing, and wherein the second full wall extendable media connector is slidably retractable into the connector housing of the second computer card housing.

35. An interlocking computer card apparatus as recited in claim 26, wherein the top planar surface of the first computer card device has at least one protrusion, and wherein the top planar surface of the second computer card device has at least one dimple, such that the at least one protrusion is coupled with the at least one dimple.

* * * * *